US011956932B2

(12) United States Patent
Cooke et al.

(10) Patent No.: US 11,956,932 B2
(45) Date of Patent: Apr. 9, 2024

(54) SYSTEMS AND METHODS FOR CONTROLLING A HYBRID AIR/LIQUID COOLING SYSTEM OF A BUILDING

(71) Applicant: Verizon Patent and Licensing Inc., Basking Ridge, NJ (US)

(72) Inventors: Lawrence Gregory Cooke, Colorado Springs, CO (US); Guering J. Fernandez, West Orange, NJ (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

(21) Appl. No.: 17/936,876

(22) Filed: Sep. 30, 2022

(65) Prior Publication Data

US 2023/0026767 A1   Jan. 26, 2023

Related U.S. Application Data

(63) Continuation of application No. 16/872,882, filed on May 12, 2020, now Pat. No. 11,477,919.

(51) Int. Cl.
*H05K 7/20* (2006.01)
*G05B 19/042* (2006.01)

(52) U.S. Cl.
CPC ....... *H05K 7/20836* (2013.01); *G05B 19/042* (2013.01); *H05K 7/20745* (2013.01); *H05K 7/2079* (2013.01); *G05B 2219/21109* (2013.01); *G05B 2219/25252* (2013.01); *G05B 2219/25257* (2013.01); *G05B 2219/2614* (2013.01)

(58) Field of Classification Search
USPC ........................................................ 700/277
See application file for complete search history.

(56) References Cited

U.S. PATENT DOCUMENTS

| 10,605,477 | B2 | 3/2020 | Ridder | |
|---|---|---|---|---|
| 2014/0301036 | A1* | 10/2014 | Chainer | H05K 7/2079 |
| | | | | 361/679.47 |
| 2017/0241661 | A1* | 8/2017 | Erpelding | F24F 11/63 |
| 2017/0347499 | A1 | 11/2017 | Ross et al. | |
| 2018/0135880 | A1* | 5/2018 | Ghadiri Moghaddam | |
| | | | | F24F 3/1411 |
| 2018/0274812 | A1* | 9/2018 | Dorste | F24F 11/0001 |
| 2019/0236446 | A1* | 8/2019 | Qin | G06N 3/044 |

* cited by examiner

*Primary Examiner* — Emilio J Saavedra

(57) ABSTRACT

A device may monitor an intake temperature of an air flow through an air intake of a building that includes a ventilation system for temperature control of a first region of the building, a liquid cooling system for temperature control of equipment that is within a second region of the building, and a heat exchanger that is thermally coupled to the ventilation system and the liquid cooling system. The device may determine that the intake temperature is below a threshold temperature. The device may control the ventilation system to cause the air flow to cool a water flow of the liquid cooling system via the heat exchanger to produce a cooled water flow. The device may control the liquid cooling system to cause the cooled water flow of the liquid cooling system to bypass a chiller system of the liquid cooling system to reduce power consumption by the chiller system.

20 Claims, 6 Drawing Sheets

SYSTEMS AND METHODS FOR CONTROLLING A HYBRID AIR/LIQUID COOLING SYSTEM OF A BUILDING

RELATED APPLICATION

This application is a continuation of U.S. patent application Ser. No. 16/872,882, entitled "SYSTEMS AND METHODS FOR CONTROLLING A HYBRID AIR/LIQUID COOLING SYSTEM OF A BUILDING," filed May 12, 2020 (now U.S. Pat. No. 11,477,919), which is incorporated herein by reference in its entirety.

BACKGROUND

A building, such as a data center, may utilize one or more types of cooling systems to cool regions, rooms, and/or equipment within the building. For example, the building may include an air cooling system, a liquid cooling system, or a hybrid air/liquid cooling system that utilizes both air cooling and liquid cooling to cool rooms and/or equipment of the building.

DETAILED DESCRIPTION OF PREFERRED EMBODIMENTS

The following detailed description of example implementations refers to the accompanying drawings. The same reference numbers in different drawings may identify the same or similar elements.

A building, such as a data center, may utilize a hybrid air/liquid cooling system to cool rooms and/or equipment within the building. The hybrid air/liquid cooling system may use cooled liquid (e.g., by a chiller system) to cool outside air (e.g., by a heat exchanger) brought into the building to cool rooms and/or equipment within the building. In some cases, the outside air may be a sufficient temperature to cool the rooms and/or equipment of the building without the use of the cooled liquid. However, some rooms and/or equipment in the building may still require use of the cooled liquid to cool the rooms and/or the equipment (e.g., where a ventilation system of the building is not configured to or is unable to reach the rooms and/or the equipment) even when the outside air is a sufficiently low temperature. As a result, the chiller system of the hybrid air/liquid cooling system must cool liquid to produce the cooled liquid. This may consume additional resources, such as power resources, electricity resources, processing resources, and/or the like, associated with operating the chiller system.

Some implementations described herein enable a hybrid air/liquid cooling system to be controlled such that intake air (e.g., outside air) may cool a water flow of a liquid cooling system when the intake air temperature satisfies a threshold temperature. The cooled water flow of the liquid cooling system may be used to cool rooms and/or equipment within the building. As a result, the chiller system of the liquid cooling system may be bypassed, and power to the chiller system may be reduced or turned off (e.g., the chiller system may be shut down). This may conserve power resources, electricity resources, processing resources, and/or the like that would have otherwise been used operating the chiller system when the intake air satisfies the threshold temperature. Additionally, the ventilation system may be enabled to reduce fan speeds, the liquid cooling system may be enabled to reduce power to one or more pumps or fans, and/or the like, conserving power resources, electricity resources, processing resources, and/or the like. Moreover, a lifespan of components of the chiller system may be extended as operating hours of the components may be reduced.

Figure 1:
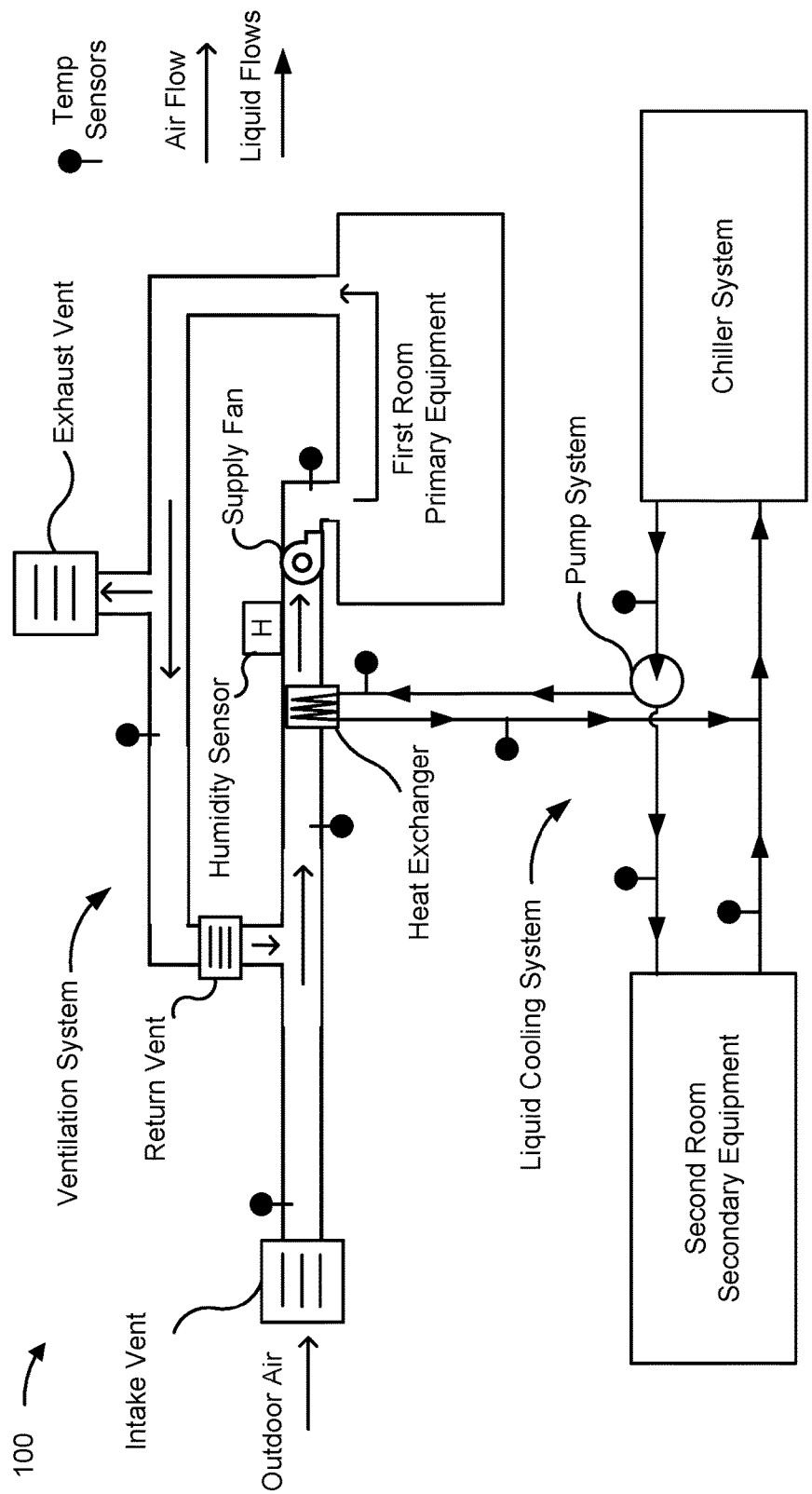
FIG. 1 is a diagram of an example hybrid air/liquid cooling system of a building described herein.

FIG. 1 is a diagram of an example 100 of a hybrid air/liquid cooling system of a building. As shown in FIG. 1, example 100 includes a ventilation system (e.g., for air cooling), a liquid cooling system (e.g., for liquid cooling), and a heat exchanger. The heat exchanger may be thermally coupled to the ventilation system and the liquid cooling system.

The ventilation system may include a system of vents and/or air ducts for supplying air to one or more rooms of the building. As described herein, a room may refer to a single room, a region of the building (e.g., one or more rooms that are temperature controlled together), and/or the like. The vents may be independently controllable to route the flow of air through the ventilation system. As shown in FIG. 1, outdoor air may enter the ventilation system through an intake vent. The intake air (e.g., the outdoor air that enters through the intake vent) may enter an air duct of the ventilation system and travel to the heat exchanger. For example, a supply fan may pull the intake air towards the heat exchanger and may force the air into a first room of the building that includes primary equipment. The primary equipment may be air cooled equipment. The primary equipment may be data center equipment, server equipment, computer equipment, network equipment, and/or the like.

The heat exchanger may be situated, within a supply vent associated with the first room, between a supply fan that induces the air flow and a return duct that returns air from the first room. The heat exchanger may be a cooling coil, a plate-and-frame heat exchanger, and/or the like. For example, a water flow from the liquid cooling system may flow within one or more coils of the heat exchanger and an air flow (e.g., the intake air) of the ventilation system may pass between the one or more coils of the heat exchanger. In this way, the heat exchanger may be thermally coupled to the ventilation system and the liquid cooling system. In some implementations, the heat exchanger may be a different type of heat exchanger, such as a plate and frame heat exchanger, a parallel-flow heat exchanger, a counter-flow heat exchanger, a shell and tube heat exchanger, and/or the like.

The liquid cooling system may provide cooled liquid, such as water, to the heat exchanger. For example, the chiller system may include a cooling tower, a condenser, an evaporator, a condenser pump, a heat exchanger, a waterside economizer, a chiller, and/or the like configured to cool water flowing in the liquid cooling system. The liquid cooling system may provide a flow of cooled water to the heat exchanger (e.g., the heat exchanger thermally coupled to the ventilation system and the liquid cooling system).

The liquid cooling system may provide a flow of cooled water to a second room or region and/or secondary equipment located within the building. The second room and/or the secondary equipment may be a liquid cooled room and/or liquid cooled equipment. For example, due to a layout of the building, a size or location of the secondary equipment, a configuration (e.g., design, type, and/or the like) of the secondary equipment, and/or the like, the ventilation system may be unable to reach the second room and/or the secondary equipment. As a result, the second room and/or the secondary equipment may be liquid cooled by the flow of cooled liquid from the chiller system. For example, the second room may include a ventilation system (e.g., that does not have access to outside air) and a heat exchanger, wherein cooled water flows through the heat exchanger to cool air flowing in the ventilation system. The cooled air in the ventilation system may be used to cool the second room. Similarly, a flow of cooled water may be provided directly to the secondary equipment (e.g., the secondary equipment may be water cooled equipment that is cooled by a flow of cooled water flowing through one or more pipes within the secondary equipment).

The primary equipment and the secondary equipment may be the same type of equipment or different type of equipment. Primary and secondary do not denote a preference, importance, rank, status, and/or the like of the equipment, but rather are used to differentiate between the air cooled equipment (primary) and the water cooled equipment (secondary).

In some implementations, an air flow of outdoor air may pass through the ventilation system. In some implementations, the outdoor air may be combined with heated air that is returned from the first room (e.g., through a return vent). The flow of air may pass through the heat exchanger and may be cooled by the flow of cooled water through the heat exchanger. The cooled air may travel into the first room (e.g., via the supply fan) and may cool the first room and/or primary equipment located in the first room. The water within the heat exchanger may be warmed by the flow of air that passes through the heat exchanger. The liquid cooling system may cause the warmed water (e.g., via one or more valves, one or more pumps, and/or the like) to return to the chiller system to be cooled.

Similarly, the liquid cooling system may cause a flow of cooled water to flow into the second room to cool the second room and/or the secondary equipment. The cooled water may be warmed by the second room and/or the secondary equipment. The liquid cooling system may cause the warmed water to return to the chiller system to be cooled.

The ventilation system may include one or more sensors to measure one or more parameters of the air flowing through the ventilation system. For example, the ventilation system may include one or more temperature sensors to measure the temperature of the air, one or more humidity sensors to measure the humidity of the air, and/or the like. Similarly, the liquid cooling system may include one or more sensors to measure one or more parameters of the water flowing through the liquid cooling system (e.g., a temperature of the water, a rate of flow of the water, a pressure of the water, and/or the like).

As indicated above, FIG. 1 is provided as an example. Other examples may differ from what is described with regard to FIG. 1. The number and arrangement of devices shown in FIG. 1 are provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Figure 2A:
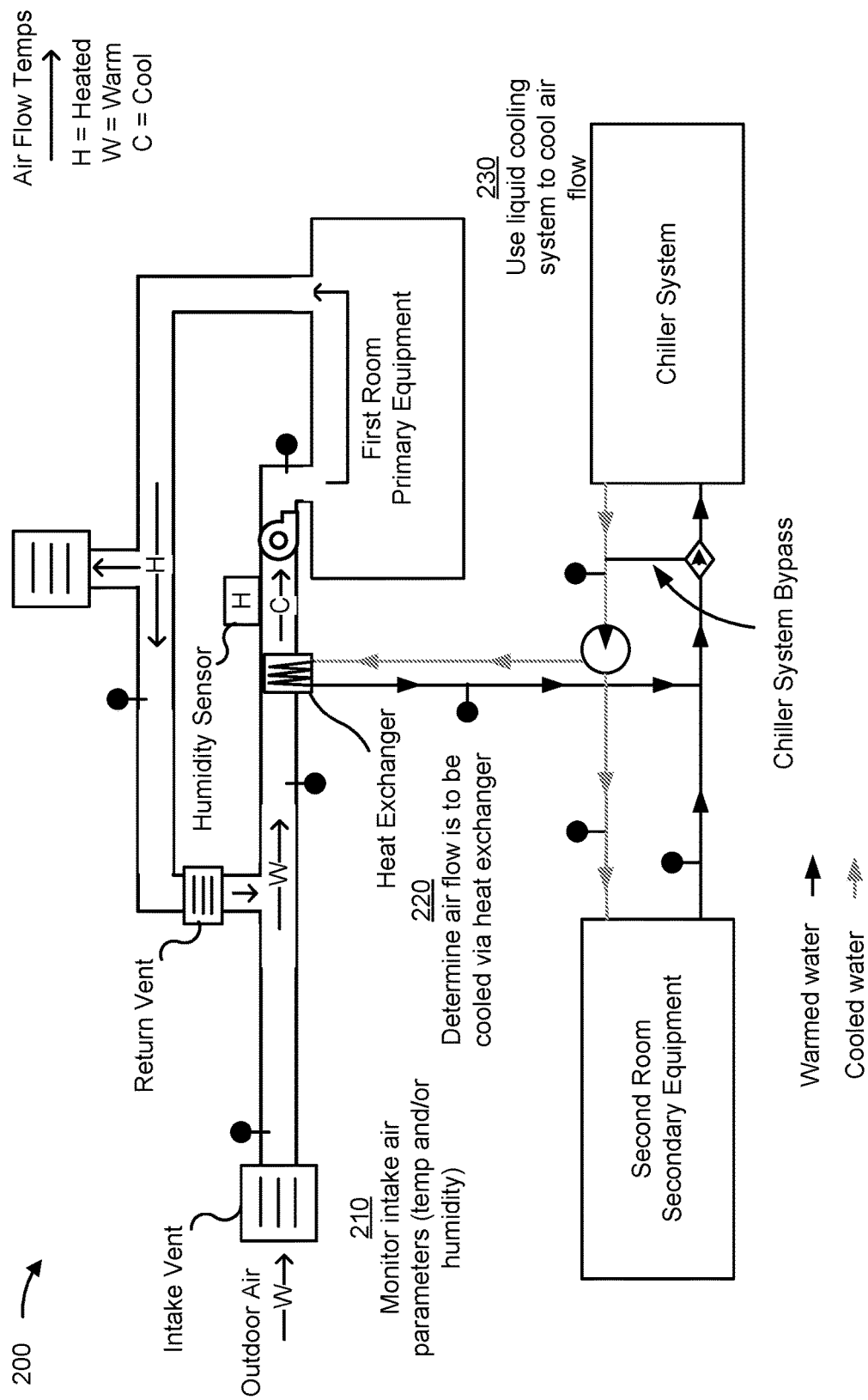
FIGS. 2A and 2B are diagrams of one or more example implementations described herein.
Figure 2B:
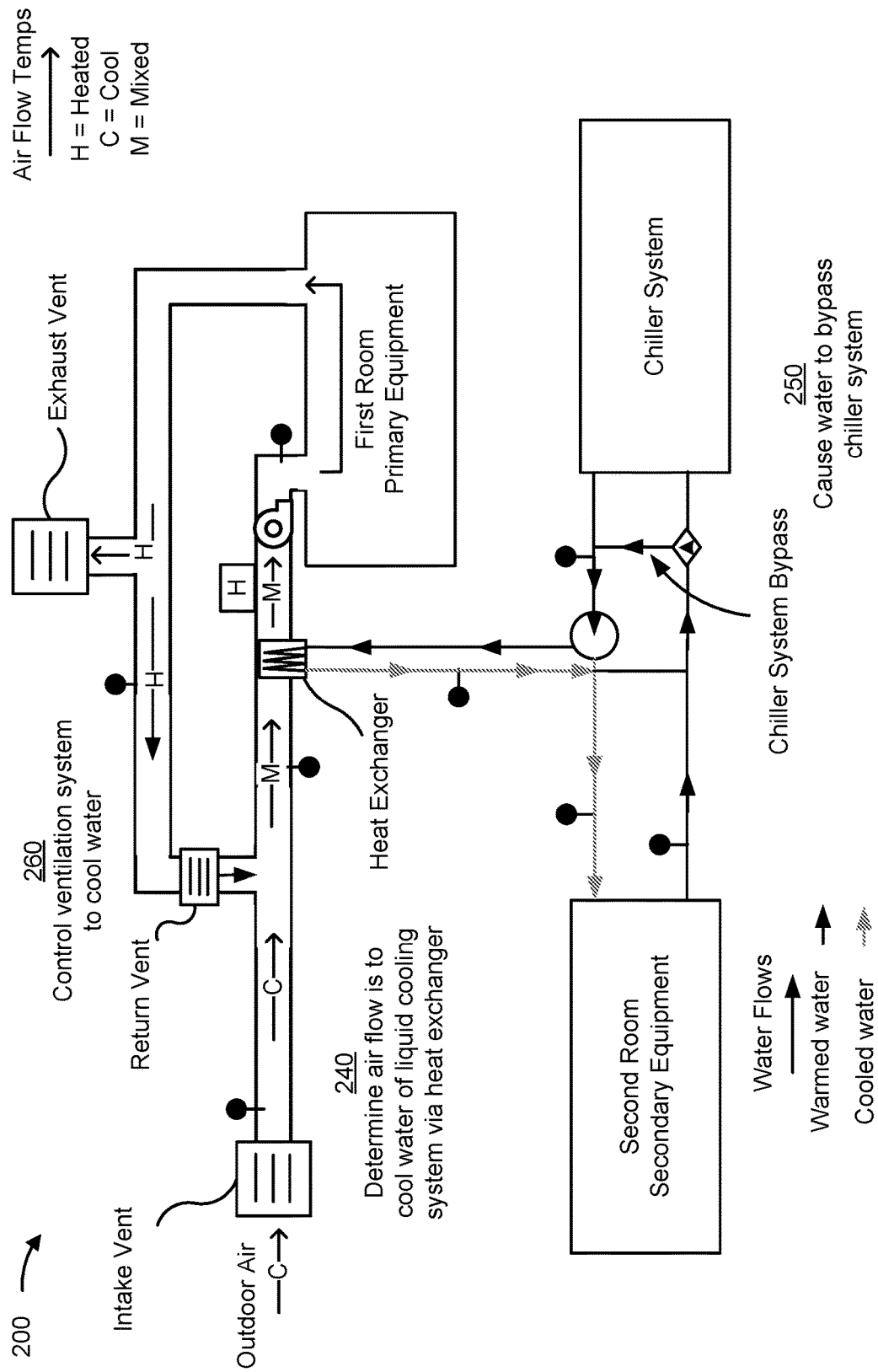

FIGS. 2A and 2B are diagrams of one or more example(s) 200 associated with systems and methods for controlling a hybrid air/liquid cooling system of a building. As shown in FIGS. 2A-2B, example(s) 200 includes a hybrid air/liquid cooling system. The hybrid air/liquid cooling system may be a similar (or the same) hybrid air/liquid cooling system as described above with respect to FIG. 1. In some implementations, the hybrid air/liquid cooling system of example(s) 200 may be the same hybrid air/liquid cooling system of FIG. 1 with the addition of a chiller system bypass. The chiller system bypass may enable the flow of water within the liquid cooling system to bypass the chiller system (e.g., via a value, a pipe, a pump, and/or the like).

As shown in FIG. 2A, and by reference number 210, the hybrid air/liquid cooling system (e.g., via a temperature control system) may monitor intake air parameters (e.g., temperature, humidity, and/or the like). The temperature control system may receive measurements of the parameters from one or more sensors positioned throughout the hybrid air/liquid cooling system. For example, a temperature sensor may be located proximate to an intake vent to measure the temperature of the intake air. Similarly, a humidity sensor may measure a humidity of the intake air. The intake air may refer to outside air, static air, and/or the like.

As shown by reference number 220, the temperature control system may determine that the air flow within the ventilation system is to be cooled via the heat exchanger. The temperature control system may determine that a temperature of the intake air (e.g., a static air temperature) does not satisfy a threshold temperature (e.g., the temperature of the intake air equals or exceeds the threshold temperature). In some implementations, the threshold temperature may be 55 degrees Fahrenheit. For example, the temperature control system may determine that the intake air should be cooled such that the intake air is able to sufficiently cool the first room and/or the primary equipment of the building. The threshold temperature may be based on a designated temperature of cooled water within the liquid cooling system, a measured temperature of water within the liquid cooling system, a thermostat setting of the first room, a temperature control setting of the primary equipment, a measured temperature of the primary equipment (e.g., based on a measurement from a sensor located at the primary equipment), and/or the like.

In some implementations, the temperature control system may determine that a humidity of the intake air does not satisfy a threshold humidity. For example, air used to cool rooms and/or equipment of the building may be required to be below a certain humidity level (e.g., as humidity in the air may damage equipment). In some implementations, the threshold humidity may be 60% relative humidity (e.g., where the percentage is the amount of water vapor present in air expressed as a percentage of the amount needed for saturation at the same temperature). The temperature control system may determine the air flow within the ventilation system is to be cooled via the heat exchanger based on the humidity of the air flow not satisfying the threshold humidity.

As shown by reference number 230, the hybrid air/liquid cooling system may use the liquid cooling system to cool the air flow in the ventilation system. The chiller system may provide cooled water (e.g., below 60 degrees Fahrenheit, between 55 and 57 degrees Fahrenheit, and/or the like) to the heat exchanger. The air within the ventilation system may pass through the heat exchanger and cool the air flow (e.g., to below 72 degrees Fahrenheit and/or the like). The rate of flow of water through the heat exchanger may be variable based on a temperature of the air entering the heat exchanger. For example, if the temperature of the air entering the heat exchanger is higher (e.g., above 85 degrees Fahrenheit, and/or the like), the liquid cooling system may provide a higher rate of flow of the cooled water through the heat exchanger. If the temperature of the air entering the heat exchanger is lower (e.g., less than 85 degrees Fahrenheit, and/or the like), the liquid cooling system may provide a lower rate of flow of the cooled water through the heat exchanger. The rate of flow of the cooled water through the heat exchanger may be varied to obtain a desired temperature of the cooled air cooling the first room and/or cooling the primary equipment.

In some implementations, the air entering the heat exchanger may be mixed air between the intake air and heated air returning from the first room. For example, the intake air may be mixed with the return air based on a return vent being open. In some implementations, the ventilation system may cause the air exiting the first room to exit the building via an exhaust vent.

In some implementations, when the temperature control system determines that the air flow within the ventilation system is to be cooled via the heat exchanger, a status of the intake vent, the return vent, and the exhaust vent may be binary. That is, the intake vent, the return vent, and the exhaust vent may either be fully open or fully closed. In some implementations, the return vent and the exhaust vent may have opposite statuses (e.g., if the exhaust vent is open, the return vent may be closed). The intake vent may be fully closed based on a temperature and/or a humidity level of the outdoor air (e.g., based on the outdoor air having a temperature and/or a humidity level above a threshold level, such that the outdoor air should not be used to cool rooms and/or equipment of the building).

As shown in FIG. 2A, the cooled water in the heat exchanger may be warmed by the air passing through the heat exchanger. The liquid cooling system may cause (e.g., via one or more pumps and/or one or more valves) the warmed water to be returned to the chiller system to be cooled. The cooled water may be provided to the heat exchanger and/or the second room and secondary equipment.

As shown in FIG. 2B, and by reference number 240, the temperature control system may determine that the air flow in the ventilation system (e.g., the intake air and/or the mixed air) is to cool the water of the liquid cooling system via the heat exchanger. The temperature control system may determine that the temperature of the intake air (e.g., a static air temperature) of the ventilation system satisfies the threshold temperature (e.g., based on a measurement performed by one or more temperature sensors). In some implementations, the temperature control system may determine that the temperature of the mixed air (e.g., intake air mixed with return air returning from the first room) satisfies the threshold temperature. For example, the temperature control system may determine that the temperature of the intake air and/or the mixed air of the ventilation system is below the threshold temperature. In some implementations, the temperature control system may verify that the temperature of the intake air of the ventilation system is below a measured temperature of the water within the liquid cooling system.

Similarly, the temperature control system may determine that the humidity of the air of the ventilation system satisfies the threshold humidity (e.g., based on a measurement performed by one or more humidity sensors). In some implementations, the humidity of the air of the ventilation system may be a humidity of the intake air, of the air at the heat exchanger, and/or the like. The temperature control system may determine that the air flow in the ventilation system is to cool the water of the liquid cooling system based on determining that the temperature of the intake air satisfies the threshold temperature and/or determining that the humidity of the intake air satisfies the threshold humidity.

The air in the ventilation system may pass through the heat exchanger (e.g., based on the supply fan causing an air flow) and into the first room to cool the first room and/or the primary equipment. Since the temperature of the air in the ventilation system satisfies the threshold temperature, the air may not need to be cooled (e.g., by the liquid cooling system) in order to cool the first room and/or the primary equipment.

In some implementations, the temperature control system may, based on determining that the temperature of the intake air and/or the mixed air satisfies the threshold temperature, reset a static pressure setpoint associated with the ventilation system. The amount of heat transferred by the air flow within the ventilation system may be a function of the rate of flow of the air, and a difference between a temperature of the air in the ventilation system and a temperature of a room and/or equipment to be cooled. As the temperature of the air in the ventilation system (e.g., the intake air temperature and/or the mixed air temperature) lowers, a rate of flow of air within the ventilation system (e.g., measured in cubic feet per minute (CFM)) may correspondingly be lowered. As a result, the temperature control system may lower the static pressure setpoint associated with the ventilation system. As a result, the temperature control system may lower a fan speed of one or more fans of the ventilation system, thereby reducing a power consumption of the ventilation system.

As shown by reference number 250, the temperature control system may cause the liquid cooling system to cause the water in the liquid cooling system to bypass the chiller system (e.g., via one or more valves, one or more pumps, and/or the like). That is, rather than return to the chiller system after passing through the heat exchanger and/or the second room, the water in the liquid cooling system may be directed back to the heat exchanger to be cooled by the air in the ventilation system via the heat exchanger. The liquid cooling system may include a chiller system bypass (e.g., a chiller bypass circuit). The chiller bypass circuit may include a bypass valve. The temperature control system may cause the liquid cooling system to cause the water in the liquid cooling system to bypass the chiller system (e.g., bypass a condenser, a condenser pump, and/or the like) by shutting off one or more chiller pumps to allow water to flow through the bypass valve and/or associated pipes.

As a result, one or more (or all) components of the chiller system may be shut down and power to the chiller system may be reduced or turned off. For example, when the chiller system is bypassed, power does not need to be provided to the chiller system. Components of the chiller system, such as the chiller, the cooler, the condenser, the cooling tower, the economizer, the evaporator, the chiller pumps, the cooling tower pumps, and/or the like, may not consume power when the chiller system is bypassed. This may conserve power resources, electricity resources, processing resources, and/or the like that would have otherwise been used operating the chiller system when the intake air satisfies the threshold temperature. Moreover, this may extend a life span of the components of the chiller system as the components may be running for less time.

As shown by reference number 260, the temperature control system may control the ventilation system to cool the water in the liquid cooling system. As the air in the ventilation system passes through the heat exchanger, the air may cool the water of the liquid cooling system that is flowing through the heat exchanger. For example, based on determining that the temperature of the intake air temperature satisfies the threshold temperature, the temperature control system may cause the liquid cooling system to provide a binary flow through the heat exchanger (e.g., a full flow, a non-restricted flow, and/or the like) to enable the water flowing though the heat exchanger to be cooled by the air in the ventilation system.

The vents of the ventilation system may be modulated or controlled by the temperature control system to produce a desired temperature of the air at the heat exchanger. The desired temperature of the air at the heat exchanger may be based on a designated temperature of the water in the liquid cooling system (e.g., a temperature to which the water in the liquid cooling system must be cooled). For example, the desired temperature of the air at the heat exchanger may be a temperature that is sufficient to cool the water in the liquid cooling system to the designated temperature. A position of the vents of the ventilation system may be modulated or controlled to allow a certain amount of air to pass through the vents. As a result, the ventilation system may mix a certain amount of intake air with a certain amount of heated air returning from the first room to produce the desired temperature.

For example, sensors may measure a temperature of the intake air, the mixed air, the air entering the first room, the air returning from the first room, and/or the like. The temperature control system may control the vents of the ventilation system based on the different measurements to produce the desired temperature of the air at the heat exchanger. In some implementations, the desired temperature of the air at the heat exchanger may be 48 degrees Fahrenheit and/or the like.

The cooled water exiting the heat exchanger may be directed, by one or more valves and/or one or more pumps of the liquid cooling system, to the second room to cool the second room and/or the secondary equipment. The water in the liquid cooling system may be warmed by the second room and/or the secondary equipment. As discussed above, rather than returning to the chiller system, the warmed water exiting the second room may be directed back to the heat exchanger to be cooled by the air in the ventilation system.

The temperature control system, after causing the liquid control system to bypass the chiller system, may determine that the intake temperature of the ventilation system no longer satisfies the threshold temperature. The temperature control system may cause the liquid control system to no longer bypass the chiller system (e.g., by starting the chiller pumps and/or the cooling tower pumps, and allowing water to flow through a heat exchanger of the chiller system) and may return power to the chiller system. As a result, the temperature control system may cause the hybrid air/liquid cooling system to return to a mode of operation where the liquid cooling system is used to cool the air in the ventilation system (e.g., as described above with respect to FIG. 2A).

In some implementations, there may be a range of intake air temperatures in which the liquid cooling system may not be used to cool the air of the ventilation system and the air of the ventilation system may not be used to cool the water of the liquid cooling system. For example, the intake air temperature may be sufficient to cool the first room and/or the primary equipment, but not sufficient to cool the water in the liquid cooling system. As a result, the temperature control system may cause the liquid cooling system to not provide water to the heat exchanger, while still providing cooled water (e.g., cooled by the chiller system, such as by a plate-and-frame heat exchanger of the chiller) to the second room and/or the secondary equipment. In that case, the chiller system may be placed in a limited operation mode (e.g., some components of the chiller system may be running while others may be shut down). The ventilation system may provide cooled air to the first room and/or the primary equipment by mixing the intake air and the return air to produce a desired temperature of the air to cool the first room and/or the primary equipment.

In some implementations, the hybrid air/liquid cooling system may have a plurality of modes. In a first mode, the hybrid air/liquid cooling system may be controlled based on a first threshold temperature (e.g., above 85 degrees Fahrenheit and/or the like). In the first mode, the hybrid air/liquid cooling system may operate with the water of the liquid cooling system cooling the air of the ventilation system via the heat exchanger (e.g., as described above with respect to FIG. 2A). In a second mode, the hybrid air/liquid cooling system may be controlled based on a threshold temperature range (e.g., between 55 degrees Fahrenheit and 85 degrees Fahrenheit and/or the like). In the second mode, the ventilation system may control the temperature of the air cooling the first room and/or the primary equipment based on mixing the intake air with the return air from the first room, as described above. The second room and/or the secondary equipment may be cooled by cooled water from the liquid cooling system (e.g., cooled by a condenser system and/or a water-to-water heat exchanger of the chiller system).

In the second mode, the chiller system may operate in a reduced power mode (e.g., the condenser system may be operating, but other components, such as a chiller, may be shut down). In a third mode, the hybrid air/liquid cooling system may be controlled based on a second threshold temperature (e.g., below 55 degrees Fahrenheit and/or the like). In the third mode, the air of the ventilation system may be used to cool the water of the liquid cooling system via the heat exchanger. A temperature of the air of the ventilation system may be controlled by mixing the intake air with the return air from the first room to produce a mixed air temperature (e.g., 48 degrees Fahrenheit and/or the like) sufficient to cool the water via the heat exchanger.

In the third mode, the entire chiller system may be shut down and the water in the liquid cooling system may be cooled entirely by the air in the ventilation system. In the third mode, the ventilation system may vary an underfloor (e.g., under a floor of the first room) pressure of the ventilation system (e.g., by resetting a static pressure setpoint associated with the ventilation system, as described above) and reduce a fan speed of one or more fans associated with the first room (and/or other rooms of the building).

As a result, the hybrid air/liquid cooling system may be controlled such that the chiller system of the liquid cooling system may be bypassed and power to the chiller system may be reduced or turned off (e.g., the chiller system may be shut down) based on an intake air temperature of the ventilation system. This may conserve power resources, electricity resources, processing resources, and/or the like that would have otherwise been used operating the chiller system when the intake air satisfies the threshold temperature. Additionally, the ventilation system may be enabled to reduce fan speeds, the liquid cooling system may be enabled to reduce power to one or more pumps or fans, and/or the like, conserving power resources, electricity resources, processing resources, and/or the like.

As indicated above, FIGS. 2A and 2B are provided as an example. Other examples may differ from what is described with regard to FIGS. 2A and 2B. The number and arrangement of devices shown in FIGS. 2A and 2B are provided as an example. In practice, there may be additional devices, fewer devices, different devices, or differently arranged devices than those shown in FIGS. 2A and 2B. Furthermore, two or more devices shown in FIGS. 2A and 2B may be implemented within a single device, or a single device shown in FIGS. 2A and 2B may be implemented as multiple, distributed devices. Additionally, or alternatively, a set of devices (e.g., one or more devices) shown in FIGS. 2A and 2B may perform one or more functions described as being performed by another set of devices shown in FIGS. 2A and 2B.

Figure 3:
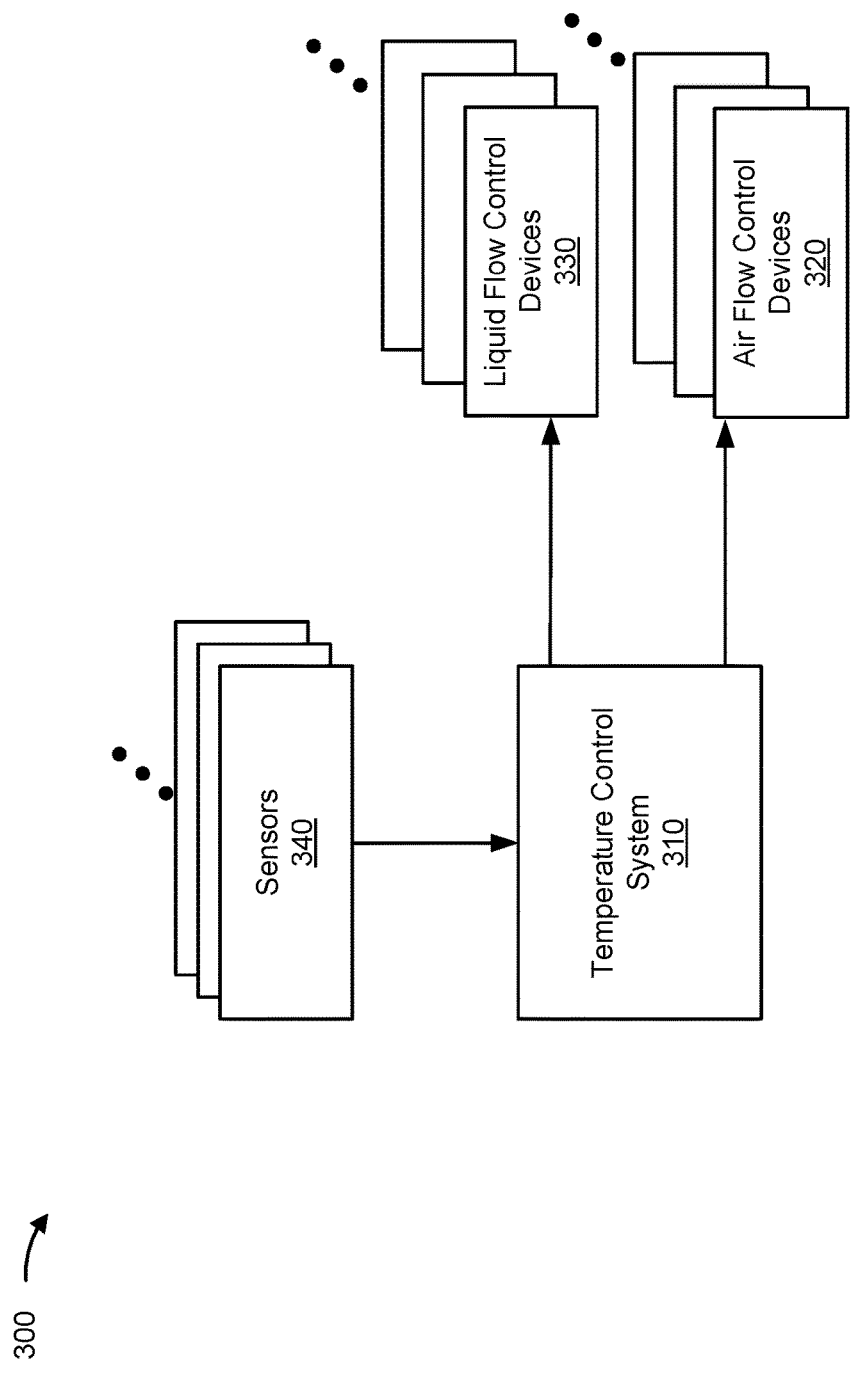
FIG. 3 is a diagram of an example system in which systems and/or methods described herein may be implemented.

FIG. 3 is a diagram of an example system 300 in which systems and/or methods described herein may be implemented. As shown in FIG. 3, system 300 includes a temperature control system 310, one or more air flow control devices 320, one or more liquid flow control devices 330, and one or more sensors 340. As described herein, temperature control system 310 is configured to control, using the one or more air flow control devices 320 and/or the one or more liquid flow control devices 330, a hybrid air/liquid cooling system of a building based on inputs received from the one or more sensors 340, and/or the like. Devices of system 300 may interconnect via wired connections, wireless connections, or a combination of wired and wireless connections. Devices of system 300 may interconnect via a cooling system of the building (e.g., a ventilation system, a liquid cooling system, and/or the like).

Temperature control system 310 may include one or more devices configured for controlling the temperature of a building. For example, temperature control system 310 may include a controller and/or processor configured to receive inputs from the sensors 340 and provide signals to the air flow control devices 320 and/or the liquid flow control devices 330 to control the air flow control devices 320 and/or the liquid flow control devices 330. Temperature control system 310 may be configured to store one or more thresholds for one or more parameters (e.g., an air temperature parameter, a water temperature parameter, an air humidity parameter, and/or the like, as described above). Temperature control system 310 may control the air flow control devices 320 and/or the liquid flow control devices 330 based on the one or more parameters (e.g., based on measurements received from the sensors 340) satisfying or not satisfying the one or more thresholds.

Air flow control devices 320 may include one or more devices configured for controlling the flow of air through the ventilation system of the building. For example, an air flow control device 320 may be a vent, a damper, a fan, a valve, a regulator, an actuator, and/or the like. The air flow control devices 320 may be configured to adjust an amount of air flowing through the ventilation system of the building based on signals or commands received from the temperature control system 310.

Liquid flow control devices 330 may include one or more devices configured for controlling the flow of liquid through a liquid cooling system (e.g., through one or more pipes, one or more heat exchangers, and/or the like) of the building. For example, a liquid flow control device 330 may be a valve, a pump, a regulator, a flow meter, an actuator, and/or the like. The liquid flow control devices 330 may include one or more devices configured for adjusting the temperature of liquid flowing though the ventilation system of the building. For example, a liquid flow control device 330 may be a chiller, a cooler, a condenser, a cooling tower, an economizer, an evaporator, and/or the like. The liquid flow control devices 330 may be configured to adjust an amount of liquid flowing through the liquid cooling system of the building and/or adjust a temperature of the liquid based on signals or commands received from the temperature control system 310.

Sensors 340 may include one or more devices for measuring one or more parameters of air and/or water of the cooling system of the building. A sensor 340 may include a temperature sensor, a humidity sensor, a pressure sensor, a motion sensor, a water flow sensor, a mass flow sensor, an air flow sensor, and/or the like. The sensors 340 may measure the one or more parameters of air and/or water and provide the measurements to the temperature control system 310.

The number and arrangement of devices and networks shown in FIG. 3 are provided as an example. In practice, there may be additional devices, fewer devices, different devices, or differently arranged devices than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of system 300 may perform one or more functions described as being performed by another set of devices of system 300.

Figure 4:
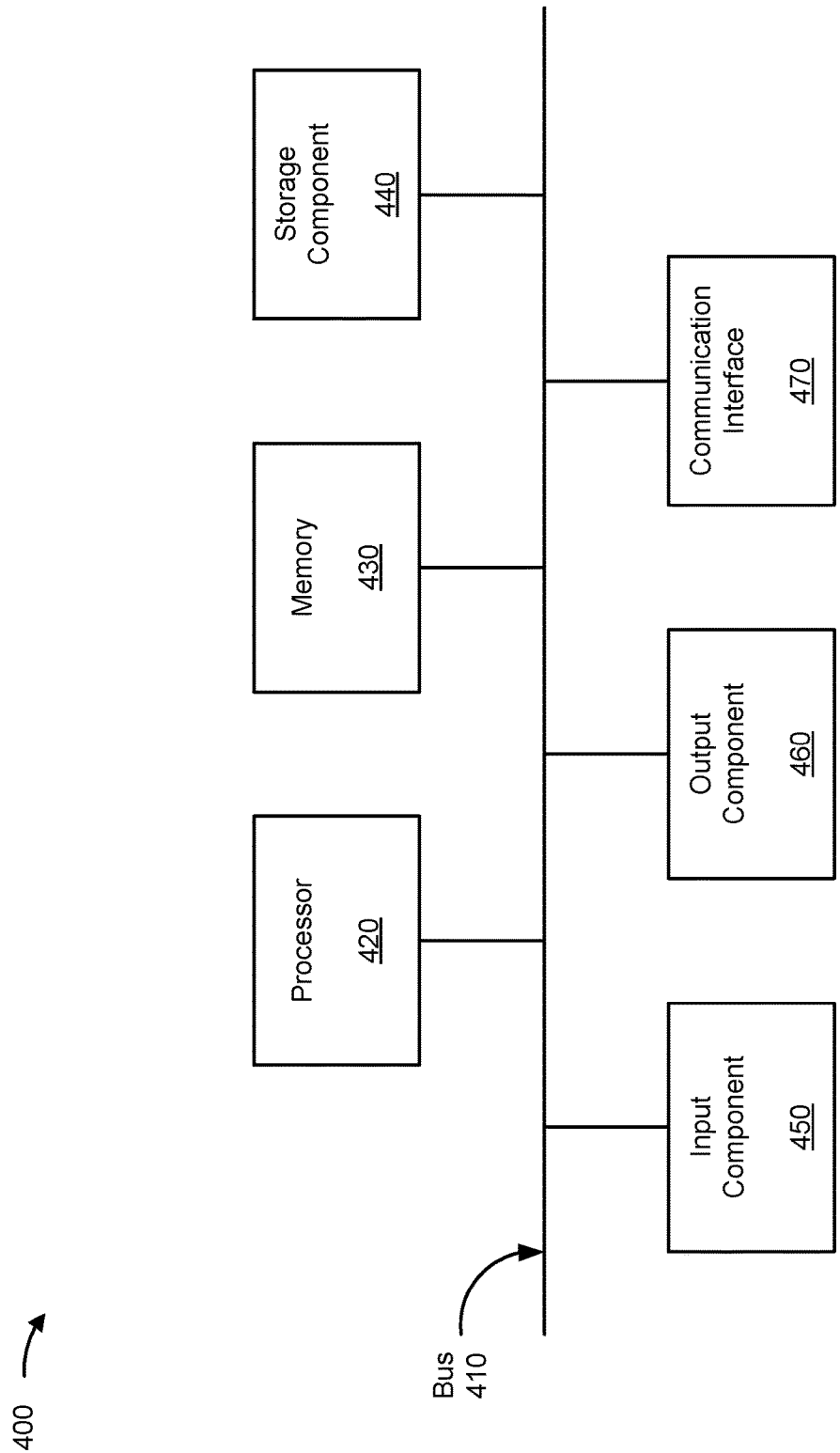
FIG. 4 is a diagram of example components of one or more devices of FIG. 3.

FIG. 4 is a diagram of example components of a device 400. Device 400 may correspond to temperature control system 320, air flow control device 320, liquid flow control device 330, and/or sensors 340. In some implementations, temperature control system 320, air flow control device 320, liquid flow control device 330, and/or sensors 340 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among the components of device 400. Processor 420 is implemented in hardware, firmware, or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random-access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a sensor for sensing information (e.g., a global positioning system (GPS) component, an accelerometer, a gyroscope, and/or an actuator). Output component 460 includes a component that provides output information from device 400 (e.g., a display, a speaker, and/or one or more LEDs).

Communication interface 470 includes a transceiver-like component (e.g., a transceiver and/or a separate receiver and transmitter) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, an RF interface, a universal serial bus (USB) interface, a wireless local area interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. A computer-readable medium is defined herein as a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
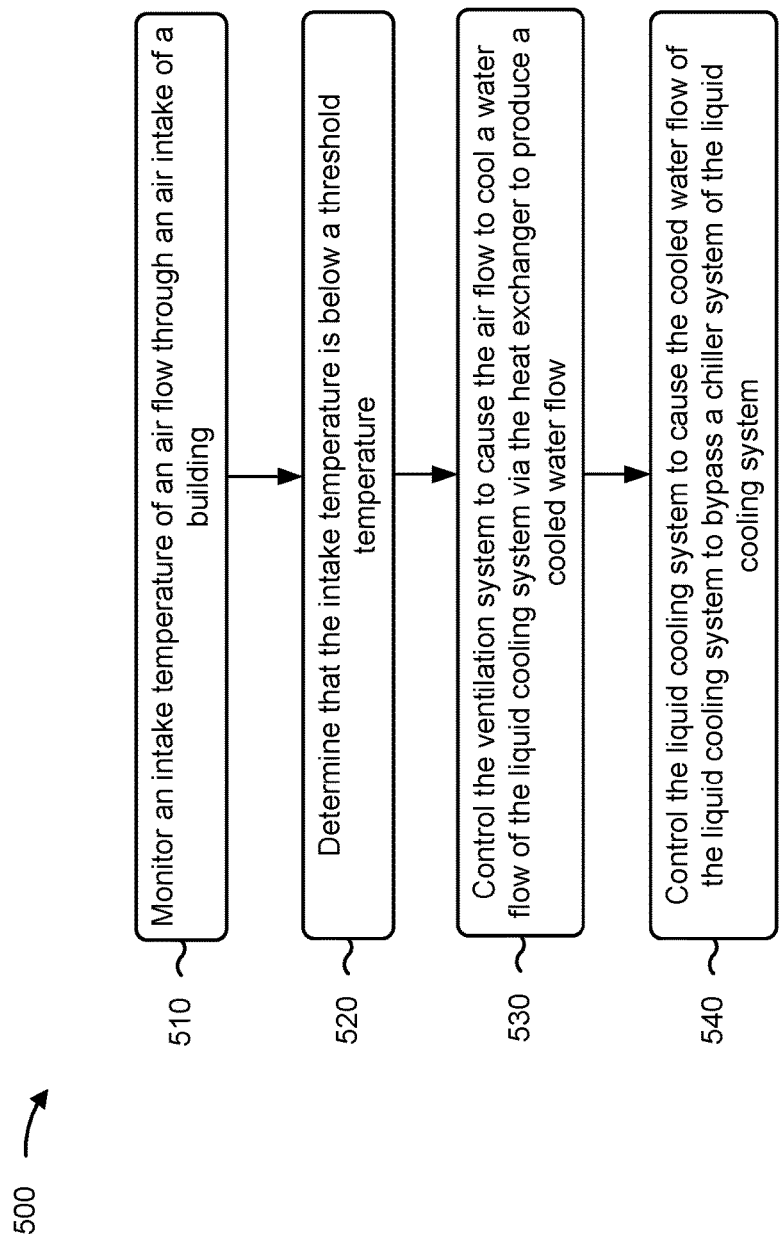
FIG. 5 is a flow chart of an example process relating to systems and methods for controlling a hybrid air/liquid cooling system of a building.

FIG. 5 is a flow chart of an example process 500 associated with systems and methods for controlling a hybrid air/liquid cooling system of a building. In some implementations, one or more process blocks of FIG. 5 may be performed by a device (e.g., temperature control system 310). In some implementations, one or more process blocks of FIG. 5 may be performed by another device or a group of devices separate from or including the device, such as one or more air flow control devices (e.g., air flow control devices 320), one or more liquid flow control devices (e.g., liquid flow control devices 330), one or more sensors (e.g., sensors 340), and/or the like. Additionally, or alternatively, one or more process blocks of FIG. 5 may be performed by one or more components of a device 400, such as processor 420, memory 430, storage component 440, input component 450, output component 460, communication interface 470, and/or the like.

As shown in FIG. 5, process 500 may include monitoring an intake temperature of an air flow through an air intake of a building (block 510). For example, the device may monitor an intake temperature of an air flow through an air intake of a building, as described above. In some implementations, the building includes a ventilation system for temperature control of a first region of the building, a liquid cooling system for temperature control of equipment that is within a second region of the building, and a heat exchanger that is thermally coupled to the ventilation system and the liquid cooling system. For example, monitoring the intake temperature may comprise receiving, from one or more temperature sensors, a measurement associated with the intake temperature, where the intake temperature is determined to be below the threshold temperature based on the measurement.

In some implementations, the heat exchanger is situated, within a supply vent associated with the first region, between a supply fan that induces the air flow and a return duct that returns air from the first region, and the heat exchanger comprises one or more coils, the air flow passes between the one or more coils, and the cooled water flows within the one or more coils.

As further shown in FIG. 5, process 500 may include determining that the intake temperature is below a threshold temperature (block 520). For example, the device may determine that the intake temperature is below a threshold temperature, as described above. For example, determining that the intake temperature is below the threshold temperature may comprise determining a value of the threshold temperature based on at least one of: a thermostat setting of the first region, or a temperature control setting of the equipment, and the intake temperature is determined to be below the threshold temperature based on a measurement of the intake temperature being below the value.

As further shown in FIG. 5, process 500 may include controlling, based on determining that the intake temperature is below the threshold temperature, the ventilation system to cause the air flow to cool a water flow of the liquid cooling system via the heat exchanger to produce a cooled water flow (block 530). For example, the device may control, based on determining that the intake temperature is below the threshold temperature, the ventilation system to cause the air flow to cool a water flow of the liquid cooling system via the heat exchanger to produce a cooled water flow, as described above.

In some implementations, controlling the ventilation system comprises: causing a supply fan of the ventilation system to produce the air flow; monitoring a return/intake mixture temperature of the air flow, where the return/intake mixture temperature is associated with an intersection of the air intake and a return duct that returns air from the first region to the air intake, and controlling, based on the return/intake mixture temperature, an intake vent of the air intake and a return vent of the return duct, where a position of the intake vent and a position of the return vent are controlled to maintain the return/intake mixture temperature that provides the cooled water flow via the heat exchanger.

As further shown in FIG. 5, process 500 may include controlling the liquid cooling system to cause the cooled water flow of the liquid cooling system to bypass a chiller system of the liquid cooling system to reduce power consumption by the chiller system (block 540). For example, the device may control the liquid cooling system to cause the cooled water flow of the liquid cooling system to bypass a chiller system of the liquid cooling system to reduce power consumption by the chiller system, as described above. For example, controlling the liquid cooling system may comprise opening a bypass valve of a chiller bypass circuit of the liquid cooling system, and reducing power to one or more components of the chiller system.

In some implementations, the cooled water flow is a first cooled water flow and the air flow is a first air flow, process 500 further comprising: after controlling the liquid cooling system, detecting that the intake temperature equals or exceeds the threshold temperature; controlling, based on detecting that the intake temperature equals or exceeds the threshold temperature, the liquid cooling system to activate the chiller system to generate a second cooled water flow that is configured to cool the first air flow to produce a second air flow, and controlling the ventilation system to supply the second air flow to the first region.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

To the extent the aforementioned implementations collect, store, or employ personal information of individuals, it should be understood that such information shall be used in accordance with all applicable laws concerning protection of personal information. Additionally, the collection, storage, and use of such information can be subject to consent of the individual to such activity, for example, through well known "opt-in" or "opt-out" processes as can be appropriate for the situation and type of information. Storage and use of personal information can be in an appropriately secure manner reflective of the type of information, for example, through various encryption and anonymization techniques for particularly sensitive information.

It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
    monitoring, by a device, an air parameter of an air flow through an air intake based on a threshold value,
        wherein the air flow, when failing to satisfy the threshold value, is configured to pass through a heat exchanger, situated between a ventilation system and a liquid cooling system, and be cooled by a cooled water flow of the liquid cooling system,
        wherein a first set of rooms is temperature controlled by the ventilation system,
        wherein equipment of a second set of rooms is temperature controlled by the liquid cooling system and lacks access to outside air and the ventilation system,
        wherein the cooled water flow is warmed by the air flow passing through the heat exchanger, and
        wherein the cooled water flow is cooled by a chiller system of the liquid cooling system;
    determining, by the device, that the air parameter satisfies the threshold value; and
    controlling, by the device and based on determining that the air parameter satisfies the threshold value, the liquid cooling system to cause the cooled water flow to bypass the chiller system and be directed to the heat exchanger and be cooled by the air flow,
        wherein controlling the liquid cooling system comprises causing the cooled water flow to flow through a bypass valve to bypass the chiller system.

2. The method of claim 1, wherein the cooled water flow, based on determining that the air parameter satisfies the threshold value, is cooled by air in the ventilation system via the heat exchanger.

3. The method of claim 1, wherein controlling the liquid cooling system comprises:
    controlling a chiller bypass circuit.

4. The method of claim 1, wherein controlling the liquid cooling system comprises:
reducing power provided to the chiller system.

5. The method of claim 1, wherein the air parameter includes:
an air temperature parameter, or
an air humidity parameter.

6. The method of claim 1, wherein the controlling the liquid cooling system comprises:
shutting off one or more chiller pumps, of the chiller system, to allow the cooled water flow to flow through the bypass valve.

7. The method of claim 1, wherein determining that the air parameter satisfies the threshold value comprises:
determining that a return/intake mixture temperature satisfies the threshold value,
wherein the return/intake mixture temperature is associated with an intersection of the air intake and a return duct that returns air from the first set of rooms to the air intake.

8. A non-transitory computer-readable medium storing a set of instructions, the set of instructions comprising:
one or more instructions that, when executed by one or more processors of a device, cause the device to:
monitor an air parameter of an air flow through an air intake based on a threshold value,
wherein the air flow, when failing to satisfy the threshold value, is configured to pass through a heat exchanger, situated between a ventilation system and a liquid cooling system, and be cooled by a cooled water flow of the liquid cooling system,
wherein a first set of rooms is temperature controlled by the ventilation system,
wherein equipment of a second set of rooms is temperature controlled by the liquid cooling system and lacks access to outside air and the ventilation system,
wherein the cooled water flow is warmed by the air flow passing through the heat exchanger, and
wherein the cooled water flow is cooled by a chiller system of the liquid cooling system;
determine that the air parameter satisfies the threshold value; and
control, based on determining that the air parameter satisfies the threshold value, the liquid cooling system to cause the cooled water flow to bypass the chiller system and be directed to the heat exchanger,
wherein the one or more instructions, that cause the device to control the liquid cooling system, cause the device to cause the cooled water flow to flow through a bypass valve to bypass the chiller system.

9. The non-transitory computer-readable medium of claim 8, wherein the cooled water flow, based on determining that the air parameter satisfies the threshold value, is cooled by air in the ventilation system via the heat exchanger.

10. The non-transitory computer-readable medium of claim 8, wherein the one or more instructions, that cause the device to control the liquid cooling system, cause the device to:
control a chiller bypass circuit.

11. The non-transitory computer-readable medium of claim 8, wherein the one or more instructions, that cause the device to control the liquid cooling system, cause the device to:
reduce power provided to the chiller system.

12. The non-transitory computer-readable medium of claim 8, wherein the air parameter includes:
an air temperature parameter, or
an air humidity parameter.

13. The non-transitory computer-readable medium of claim 8, wherein the one or more instructions, that cause the device to control the liquid cooling system, cause the device to:
shut off one or more chiller pumps, of the chiller system, to allow the cooled water flow to flow through the bypass valve.

14. The non-transitory computer-readable medium of claim 8, wherein the one or more instructions, that cause the device to determine that the air parameter satisfies the threshold value, cause the device to:
determine that a return/intake mixture temperature satisfies the threshold value,
wherein the return/intake mixture temperature is associated with an intersection of the air intake and a return duct that returns air from the first set of rooms to the air intake.

15. A device, comprising:
one or more processors configured to:
monitor an air parameter of an air flow through an air intake of a building based on a threshold value,
wherein the air flow, when failing to satisfy the threshold value, is configured to pass through a heat exchanger, situated between a ventilation system and a liquid cooling system, and be cooled by a cooled water flow of the liquid cooling system,
wherein a first set of rooms is temperature controlled by the ventilation system,
wherein equipment of a second set of rooms is temperature controlled by the liquid cooling system and lacks access to outside air and the ventilation system,
wherein the cooled water flow is warmed by the air flow passing through the heat exchanger, and
wherein the cooled water flow is cooled by a chiller system of the liquid cooling system;
determine that the air parameter satisfies the threshold value; and
control, based on determining that the air parameter satisfies the threshold value, the liquid cooling system to cause the cooled water flow to bypass the chiller system and be directed to the heat exchanger,
wherein the one or more processors, to control the liquid cooling system, are configured to cause the cooled water flow to flow through a bypass valve to bypass the chiller system.

16. The device of claim 15, wherein the cooled water flow, based on determining that the air parameter satisfies the threshold value, is cooled by air in the ventilation system via the heat exchanger.

17. The device of claim 15, wherein the one or more processors, to control the liquid cooling system, are configured to:
control a chiller bypass circuit.

18. The device of claim 15, wherein the air parameter includes:
an air temperature parameter, or
an air humidity parameter.

19. The device of claim 15, wherein the one or more processors, to control the liquid cooling system, are configured to:
- shut off one or more chiller pumps, of the chiller system, to allow the cooled water flow to flow through the bypass valve.

20. The device of claim 15, wherein the one or more processors, to determine that the air parameter satisfies the threshold value, are configured to:
- determine that a return/intake mixture temperature satisfies the threshold value,
- wherein the return/intake mixture temperature is associated with an intersection of the air intake and a return duct that returns air from the first set of rooms to the air intake.

\* \* \* \* \*